United States Patent
Ogata et al.

(10) Patent No.: US 9,684,332 B2
(45) Date of Patent: Jun. 20, 2017

(54) TIMING CONTROL CIRCUIT

(71) Applicant: FUJITSU LIMITED, Kawasaki-shi, Kanagawa (JP)

(72) Inventors: Yuuki Ogata, Kawasaki (JP); Yoichi Koyanagi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 213 days.

(21) Appl. No.: 14/177,935

(22) Filed: Feb. 11, 2014

(65) Prior Publication Data

US 2014/0325253 A1 Oct. 30, 2014

(30) Foreign Application Priority Data

Apr. 26, 2013 (JP) .................................. 2013-094125

(51) Int. Cl.
*H03K 5/133* (2014.01)
*G06F 1/08* (2006.01)
*H03K 5/00* (2006.01)

(52) U.S. Cl.
CPC ............... *G06F 1/08* (2013.01); *H03K 5/133* (2013.01); *H03K 2005/00058* (2013.01)

(58) Field of Classification Search
CPC ..................... H03K 5/133; H03K 2005/00058
See application file for complete search history.

(56) References Cited

U.S. PATENT DOCUMENTS

| | | | |
|---|---|---|---|
| 4,922,141 A * | 5/1990 | Lofgren | H03H 9/38 327/158 |
| 5,087,842 A * | 2/1992 | Pulsipher | H03K 5/131 327/270 |

(Continued)

FOREIGN PATENT DOCUMENTS

| | | |
|---|---|---|
| JP | 5-22274 | 1/1993 |
| JP | 2001-44976 | 2/2001 |

(Continued)

OTHER PUBLICATIONS

Japanese Office Action dated Nov. 22, 2016 in corresponding Japanese Patent Application No. 2013-094125 (5 pages) (4 pages English Translation).

*Primary Examiner* — Thomas Lee
*Assistant Examiner* — Gary Collins
(74) *Attorney, Agent, or Firm* — Staas & Halsey LLP

(57) ABSTRACT

A timing control circuit includes a first variable-delay circuit, a multiplexer, a second variable-delay circuit, a decision circuit, and a control circuit. The first variable-delay circuit receives first data having a first communication speed and delays the first data by a variable delay. The multiplexer receives a first variable-delay circuit output and converts, based on a first control signal, the first data into second data having a second communication speed different from the first communication speed. The second variable-delay circuit receives third data having the first communication speed, and delays the third data by another variable-delay corresponding to the variable-delay of the first variable-delay circuit. The decision circuit compares a second variable-delay circuit output phase and a first control signal phase. The control circuit controls the variable-delay of the first variable-delay circuit and the another variable delay of the second variable-delay circuit based on decision circuit comparison.

14 Claims, 10 Drawing Sheets

(56) References Cited

U.S. PATENT DOCUMENTS

| | | | |
|---|---|---|---|
| 5,126,602 A | | 6/1992 | Lee et al. |
| 5,726,990 A | * | 3/1998 | Shimada ................ H03M 9/00 327/407 |
| 5,781,056 A | * | 7/1998 | Fujii ...................... H03K 5/135 327/233 |
| 5,963,606 A | * | 10/1999 | Drost ........................ H03L 7/07 327/161 |
| 6,025,745 A | * | 2/2000 | Lee ........................ H03K 5/131 327/262 |
| 6,127,872 A | * | 10/2000 | Kumata ............... H03K 3/0315 327/276 |
| 6,150,863 A | * | 11/2000 | Conn ..................... H03K 5/133 327/270 |
| 6,525,585 B1 | * | 2/2003 | Iida ........................ H03K 5/131 327/270 |
| 6,597,213 B1 | * | 7/2003 | Weintraub ......... H03K 5/00006 327/117 |
| 6,628,679 B1 | * | 9/2003 | Talarek ................... H04J 3/047 370/536 |
| 6,636,532 B1 | * | 10/2003 | Dorschky ............... H04J 3/047 370/537 |
| 7,231,306 B1 | * | 6/2007 | Rajan ..................... H04L 7/0091 702/89 |
| 7,308,060 B1 | * | 12/2007 | Wall ........................ H03L 7/081 375/355 |
| 7,463,680 B2 | * | 12/2008 | Buckwalter .......... H03H 11/265 375/233 |
| 7,782,990 B1 | * | 8/2010 | Snow ........................ H03L 7/08 375/355 |
| 2003/0053576 A1 | * | 3/2003 | Cao ..................... H03D 13/003 375/375 |
| 2004/0046589 A1 | * | 3/2004 | Gauthier ............... G06F 9/3869 326/93 |
| 2004/0086002 A1 | * | 5/2004 | Dally ...................... H04J 3/047 370/539 |
| 2004/0236977 A1 | * | 11/2004 | Kizer ........................ G06F 1/12 713/500 |
| 2007/0047686 A1 | * | 3/2007 | Aoki ..................... H03L 7/0814 375/374 |
| 2007/0064781 A1 | | 3/2007 | Yamaguchi et al. |
| 2008/0061851 A1 | * | 3/2008 | Jeon ...................... H03L 7/0814 327/158 |
| 2008/0285598 A1 | * | 11/2008 | Farbarik ............... H03L 7/0814 370/516 |
| 2008/0298476 A1 | * | 12/2008 | Bereza ............... H03K 5/15026 375/257 |
| 2009/0091362 A1 | * | 4/2009 | Pellerano ............. H03L 7/0812 327/158 |
| 2009/0140773 A1 | * | 6/2009 | Cheung ................... H03L 7/091 327/3 |
| 2011/0181451 A1 | * | 7/2011 | Tsunoda ................. H03M 9/00 341/101 |
| 2011/0187433 A1 | * | 8/2011 | Baumann ............... H03K 5/135 327/276 |
| 2011/0191548 A1 | * | 8/2011 | Miller ................. G06F 13/1647 711/153 |
| 2012/0133394 A1 | * | 5/2012 | Fukuda .................... H03K 5/26 327/12 |
| 2012/0201289 A1 | * | 8/2012 | Abdalla ............. H04L 25/0272 375/233 |

FOREIGN PATENT DOCUMENTS

| | | |
|---|---|---|
| JP | 2007-82147 | 3/2007 |
| JP | 2009-212735 | 9/2009 |

* cited by examiner

| LOGICAL CIRCUIT INPUT | | | LOGICAL CIRCUIT OUTPUT (SELECTOR CONTROL SIGNAL) | | |
|---|---|---|---|---|---|
| FILTER OUTPUT | ⟨1⟩ | ⟨0⟩ | ⟨1⟩ | ⟨0⟩ | DECIMAL NOTATION |
| 0 | 0 | 0 | 0 | 0 | 0 |
|   | 0 | 1 | 0 | 0 | 0 |
|   | 1 | 0 | 0 | 1 | 1 |
|   | 1 | 1 | 1 | 0 | 2 |
| 1 | 0 | 0 | 0 | 1 | 1 |
|   | 0 | 1 | 1 | 0 | 2 |
|   | 1 | 0 | 1 | 1 | 3 |
|   | 1 | 1 | 1 | 1 | 3 |

TIMING CONTROL CIRCUIT

CROSS-REFERENCE TO RELATED APPLICATION

This application is based upon and claims the benefit of priority from the prior Japanese Patent Application No. 2013-094125 filed on Apr. 26, 2013, the entire contents of which are incorporated herein by reference.

FIELD

The embodiment discussed in this specification is related to a timing control circuit.

BACKGROUND

In recent years, performances of parts used in a computer and the other information processing apparatuses have been improved significantly. For example, performance improvement of a semiconductor memory, such as a static random access memory (SRAM), a dynamic random access memory (DRAM), and so on, a central processing unit (CPU): processor, a switching large scale integration (LSI), and so on, is remarkable.

And with the performance improvement of these semiconductor memories, processors, and so on, situations are arising where it becomes difficult to improve system performance unless signal transmission rates among individual parts and components are improved.

That is to say, it becomes important to improve signal transmission rates between a main memory, such as a DRAM and so on, and a processor, between servers through a network, between boards (printed wiring boards), or between semiconductor chips, and between elements and circuit blocks in one chip.

Incidentally, in order to increase a signal transfer rate, for example it is preferable to employ a serial transmission method that is capable of excluding skew between bits, which is caused by differences of wiring lines, and becomes a problem in a parallel transmission method.

Specifically, a communication speed of a circuit that transmits and receives data at a high speed (for example, a serializer and deserializer (SerDes): parallel-serial conversion circuit almost reaches to tens of Gbps. And in Ethernet (a registered trademark), a transmission standard of 25 Gbps has already appeared. Further, standardization of 40 Gbps and 56 Gbps (for example, CEI-56G-VSR) is in progress.

Incidentally, to date, proposals have been made of various timing control circuits that make it possible to correct data transmission and reception at a high data transfer rate.

Related-art techniques have been disclosed in Japanese Laid-open Patent Publication Nos. 2007-082147, 2001-044976, 5-022274, and 2009-212735, for examples.

To date, SerDes has been using a phase interpolator in order to adjust timings of input data and a clock, for example. The use of the phase interpolator makes it possible to correctly adjust data sampling point. However, there are problems in that an occupied area of a circuit becomes large, and the power consumption increases.

SUMMARY

According to an aspect of the embodiments, a timing control circuit includes: a first variable delay circuit configured to receive first data having a first communication speed, and to give a variable delay to the first data; a first multiplexer configured to receive output of the first variable delay circuit, and to convert into second data having a second communication speed different from the first communication speed in accordance with first control signal; a second variable delay circuit configured to receive third data having the first communication speed, and to give a delay corresponding to the delay of the first variable delay circuit to the third data; a decision circuit configured to compare timings of output of the second variable delay circuit and the first control signal; and a control circuit configured to control the delays of the first variable delay circuit and the second variable delay circuit in accordance with output of the decision circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

First, before describing a timing control circuit according to the embodiment in detail, a description will be given of examples of a multiplexer and a timing control circuit, and the problems thereof with reference to FIG. 1 to FIG. 3.

Figure 1:
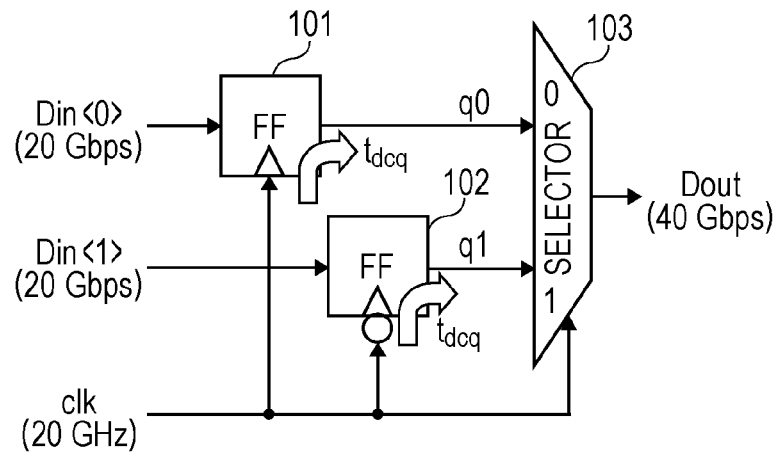
FIG. 1 is a block diagram illustrating an example of a multiplexer.

FIG. 1 is a block diagram illustrating an example of a multiplexer. FIG. 2 is a timing chart for explaining operation of the multiplexer illustrated in FIG. 1. As illustrated in FIG. 1, a multiplexer (a 2:1 multiplexer) includes flip-flops (FF) 101 and 102, and a selector 103.

Figure 2:
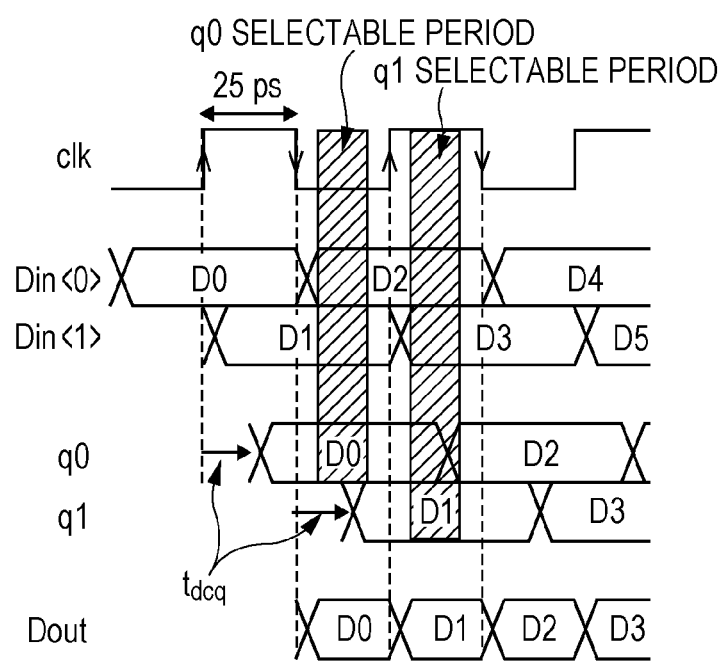
FIG. 2 is a timing chart for explaining operation of the multiplexer illustrated in FIG. 1.

As illustrated in FIG. 2, the FF101 fetches and holds data D0, D2, D4, . . . of input data Din<0> at rising timing of a clock clk. Also, the FF102 fetches and holds data D1, D3, D5, . . . of input data Din<1> at falling timing of the clock clk.

The selector 103 selects output data q0 (D0, D2, . . . ) held in the FF101, or output data q1 (D1, D3, . . . ) held in the FF102 in accordance with a level of the clock clk (a low level "0" and a high level "1"), and outputs the data (the second data) Dout.

Here, the data Din<0> and Din<1> that are input into the FF101 and the FF102 are signals of 20 Gbps, for example. Also, the data Dout output from the selector 103 is a signal of 40 Gbps, which is a signal having a rate two times that of the data Din<0> and the Din<1>, for example.

That is to say, the 2:1 multiplexer illustrated in FIG. 1 outputs a serial signal of 40 Gbps from the two parallel signals having 20 Gbps using the clock clk of 20 GHz. In this regard, a reference symbol tdcq denotes a delay time by the FF101 and the FF102, for example.

Here, as illustrated in FIG. 2, periods (selectable periods) in which the output data q0 of the FF101 and the output data q1 of the FF102 are allowed to be selected by the selector 103 are stable periods excluding transition periods of the individual data D0, D1, D2, . . . .

That is to say, it becomes difficult for the selector 103 to select and output a correct value unless the setting is determined such that the switching timings of the data q0 and q1 by the selector 103 are included in the selectable periods of the output data q0 and q1 of FF101 and 102, respectively.

Incidentally, it has become difficult for SerDes, in which such a multiplexer is employed, to sufficiently ensure a timing margin between the clock and the data, for example because of an increase in operation speed. Accordingly, SerDes that performs high-speed operation might malfunction, for example if a temperature or a power source voltage changes during operation.

Figure 3:
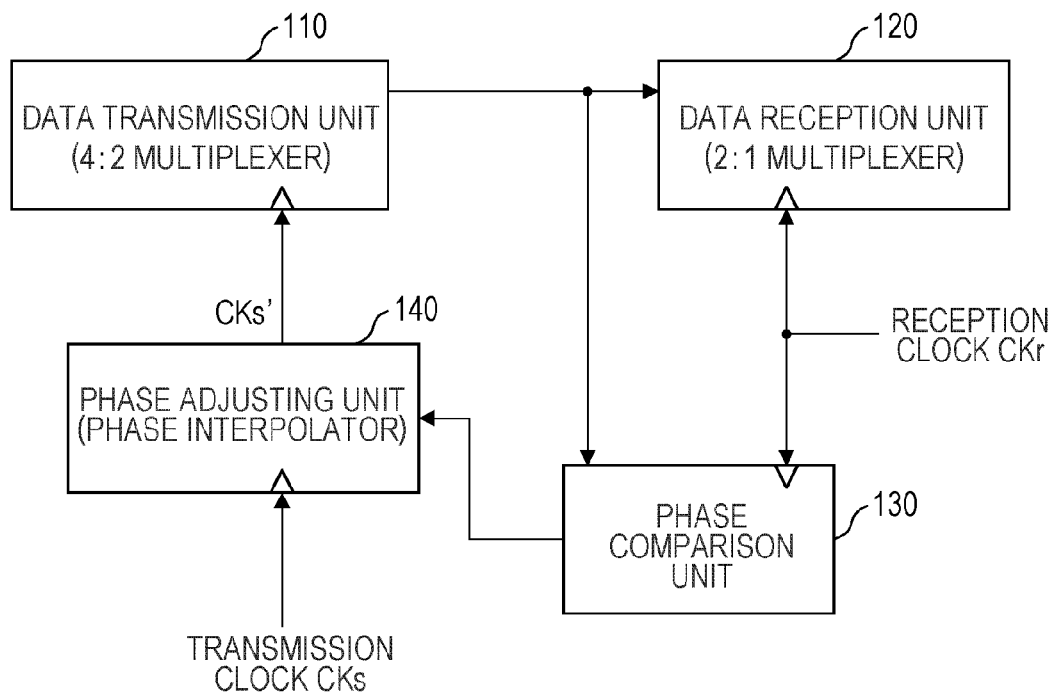
FIG. 3 is a block diagram illustrating an example of a timing control circuit.

FIG. 3 is a block diagram illustrating an example of a timing control circuit. FIG. 3 illustrates an example of a timing control circuit that converts four parallel signals into a serial signal. In FIG. 3, a reference symbol 110 denotes a data transmission unit (4:2 multiplexer), a reference symbol 120 denotes a data reception unit (2:1 multiplexer), a reference symbol 130 denotes a phase comparison unit, and a reference symbol 140 denotes a phase adjusting unit (phase interpolator).

In the timing control circuit illustrated in FIG. 3, the phase comparison unit 130 compares the phase of the output data of the 4:2 multiplexer 110 and the phase of a reception clock CKr that controls the 2:1 multiplexer, and outputs a comparison result to the phase interpolator 140.

The phase interpolator 140 adjusts the phase of an input transmission clock CKs in accordance with the comparison result from the phase comparison unit 130, and outputs the phase-adjusted transmission clock CKs' to the 4:2 multiplexer 110.

Thereby, the input data (the output data from the 4:2 multiplexer 110) of the 2:1 multiplexer 120 and the reception clock CKr are synchronized.

That is to say, the 2:1 multiplexer 120 performs selection operation correctly in accordance with the reception clock CKr in the selectable periods of data q0 and q1 in FIG. 2, for example, and outputs serial data.

For example, the 4:2 multiplexer 110 converts four pieces of parallel data of 10 Gbps into two pieces of parallel data of 20 Gbps, and the 2:1 multiplexer 120 converts the two pieces of parallel data of 20 Gbps into serial data of 40 Gbps.

In this regard, the 4:2 multiplexer 110 may include two 2:1 multiplexers, which converts two pieces of parallel data of 10 Gbps into serial data of 20 Gbps, for example.

Here, the final-phase 2:1 multiplexer 120, which performs conversion into a serial signal and outputs the signal, handles the highest frequency signal, and thus a timing margin of the data input into this final-phase 2:1 multiplexer 120 and the clock (reception clock) becomes minimum.

This happens not only in the case of converting four parallel signals into a serial signal. In the case of a final-phase 2:1 multiplexer that converts a plurality of parallel signals (for example, 8 or 16 parallel signals) into a serial signal, a timing margin becomes minimum in the same manner.

In this manner, when the frequency of serially converted data becomes high, the timing margin becomes small, and thus, for example it is demanded that the phase interpolator 140 perform phase control of the transmission clock with high precision.

Here, it is possible to perform correct control on data sampling point using the transmission clock CKs' that is phase adjusted by the phase interpolator 140. However, the phase interpolator 140 is an analog circuit, and thus not only the circuit structure becomes complicated, and the occupied area of the circuit becomes large, but also the power consumption increases.

Figure 4:
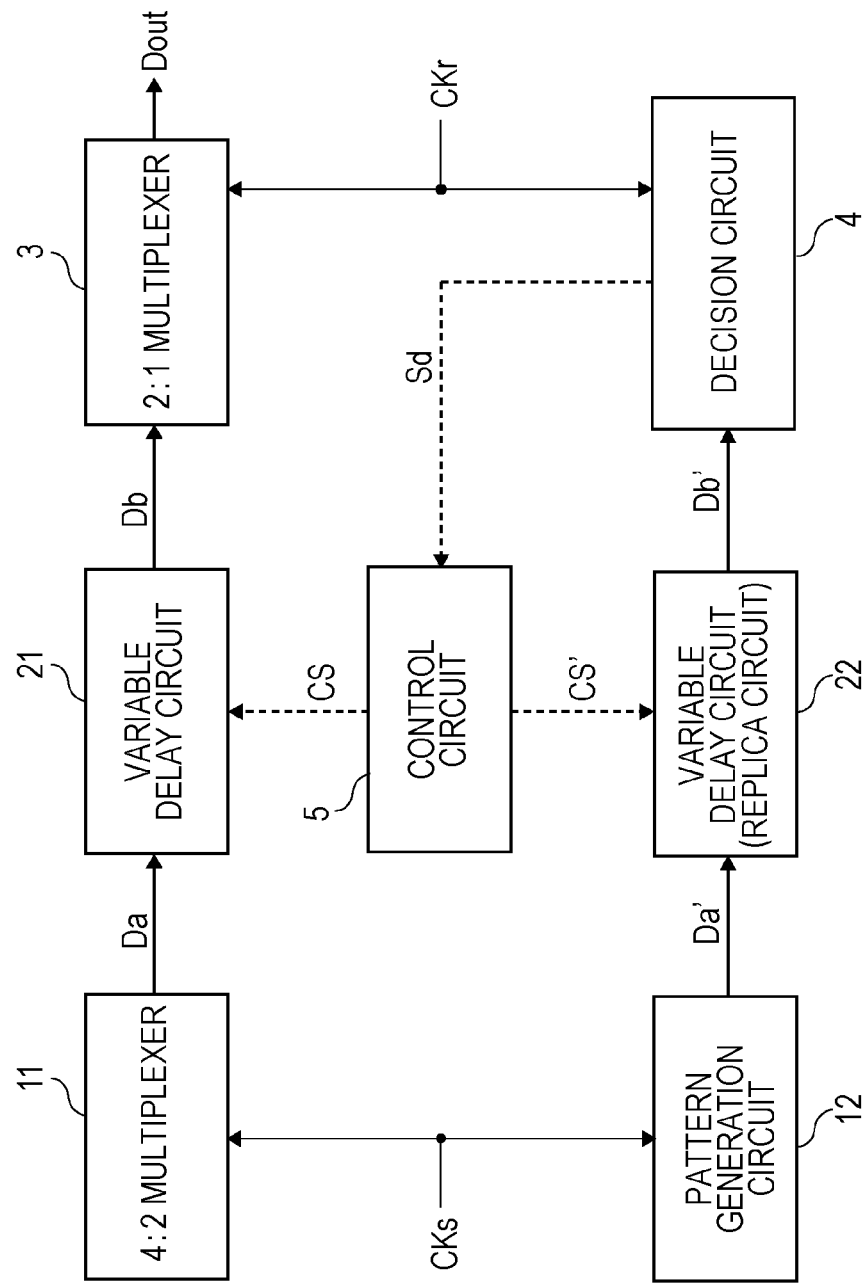
FIG. 4 is a block diagram illustrating a timing control circuit according to an embodiment.

In the following, a detailed description will be given of a timing control circuit according to the present embodiment with reference to the accompanying drawings. FIG. 4 is a block diagram illustrating a timing control circuit according to an embodiment. FIG. 4 illustrates an example of the timing control circuit that converts four parallel signals into a serial signal.

As illustrated in FIG. 4, the timing control circuit according to the embodiment includes a 4:2 multiplexer 11, a variable delay circuit 21, a 2:1 multiplexer 3, a decision circuit 4, and a control circuit 5. Further, the timing control circuit according to the embodiment includes a pattern generation circuit 12, and a variable delay circuit (a replica circuit: a second variable delay circuit) 22.

The 4:2 multiplexer 11 converts four input data into two output data Da (first data) in accordance with a transmission clock CKs (second control signal), and outputs the data. The variable delay circuit (first variable delay circuit) 21 outputs two output data Db, which is produced by giving a predetermined delay to the two input data (two output data) Da, to the 2:1 multiplexer 3 (first multiplexer).

The 2:1 multiplexer 3 converts the two input data (the two output data) Db into serial data Dout in accordance with the reception clock CKr (first control signal), and outputs the data.

The pattern generation circuit 12 generates data Da' (third data) having a predetermined pattern (for example, a repetitive pattern alternately including a low level "0" and a high level "1", "010101 . . . ") in accordance with the transmission clock CKs, and outputs the data to the variable delay circuit 22.

Here, the variable delay circuit 22 has the same circuit configuration as the variable delay circuit 21, and is used as a replica circuit that gives the same delay as that of a circuit to be actually used. In this regard, the pattern generation circuit 12 may have the same circuit configuration as that of the actual 4:2 multiplexer 11. However, the pattern generation circuit 12 does not have the same circuit configuration as long as substantially same functions are achieved as described with reference to FIG. 5.

The decision circuit 4 receives a signal (data Db'), which is produced by delaying the output (data Da') of the pattern generation circuit 12 by the variable delay circuit 22, and the reception clock CKr to compare the phases thereof, and controls delays of the data Db and Db' through the control circuit 5.

The decision circuit 4 and the control circuit 5 perform control such that the data Db' from the variable delay circuit 22 and the reception clock CKr (clk0°: the first control signal) have a suitable phase relationship so that the 2:1 multiplexer 3 is allowed to process the data Db from the variable delay circuit 21 correctly.

Here, in a timing control circuit according to the present embodiment, the variable delay circuit 21 gives a proper delay to the input data Da, and outputs the delayed data Db to the 2:1 multiplexer 3.

The 2:1 multiplexer 3 controls the data Db having a suitable phase relationship in accordance with the reception clock CKr. In this regard, the transmission clock CKs has a frequency (f/2) half the frequency f of the reception clock CKr.

In the timing control circuit according to the present embodiment described above, it is possible to form the variable delay circuit 21 (22) by, for example a simple digital circuit including a delay element and a selector as described later.

That is to say, it is possible for the timing control circuit according to the present embodiment to correctly adjust a data sampling point without using an analog phase interpolator having a complicated circuit structure, a large occupied area and high power consumption.

Figure 5:
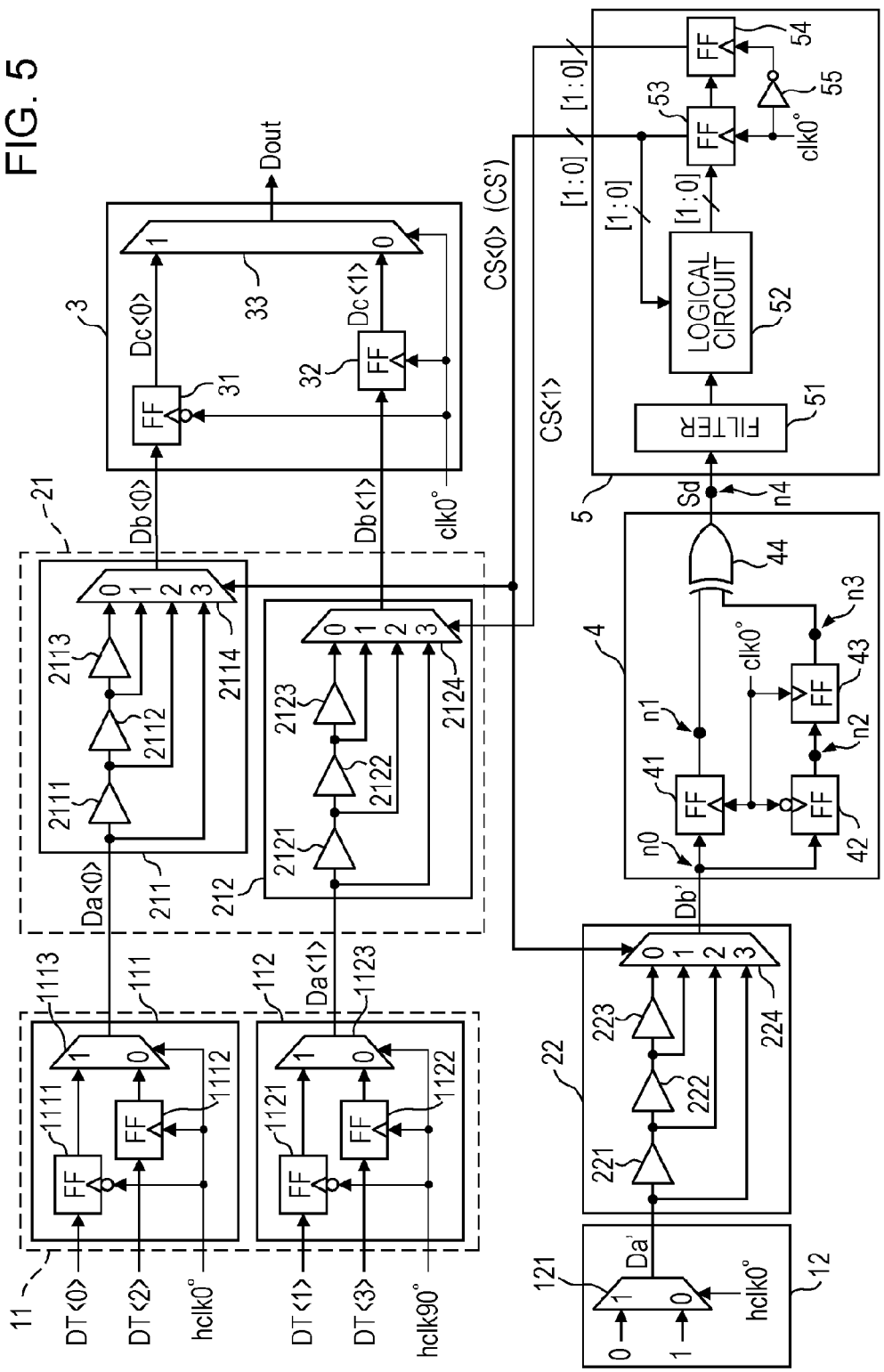
FIG. 5 is a block diagram illustrating a timing control circuit according to the embodiment.
Figure 6:
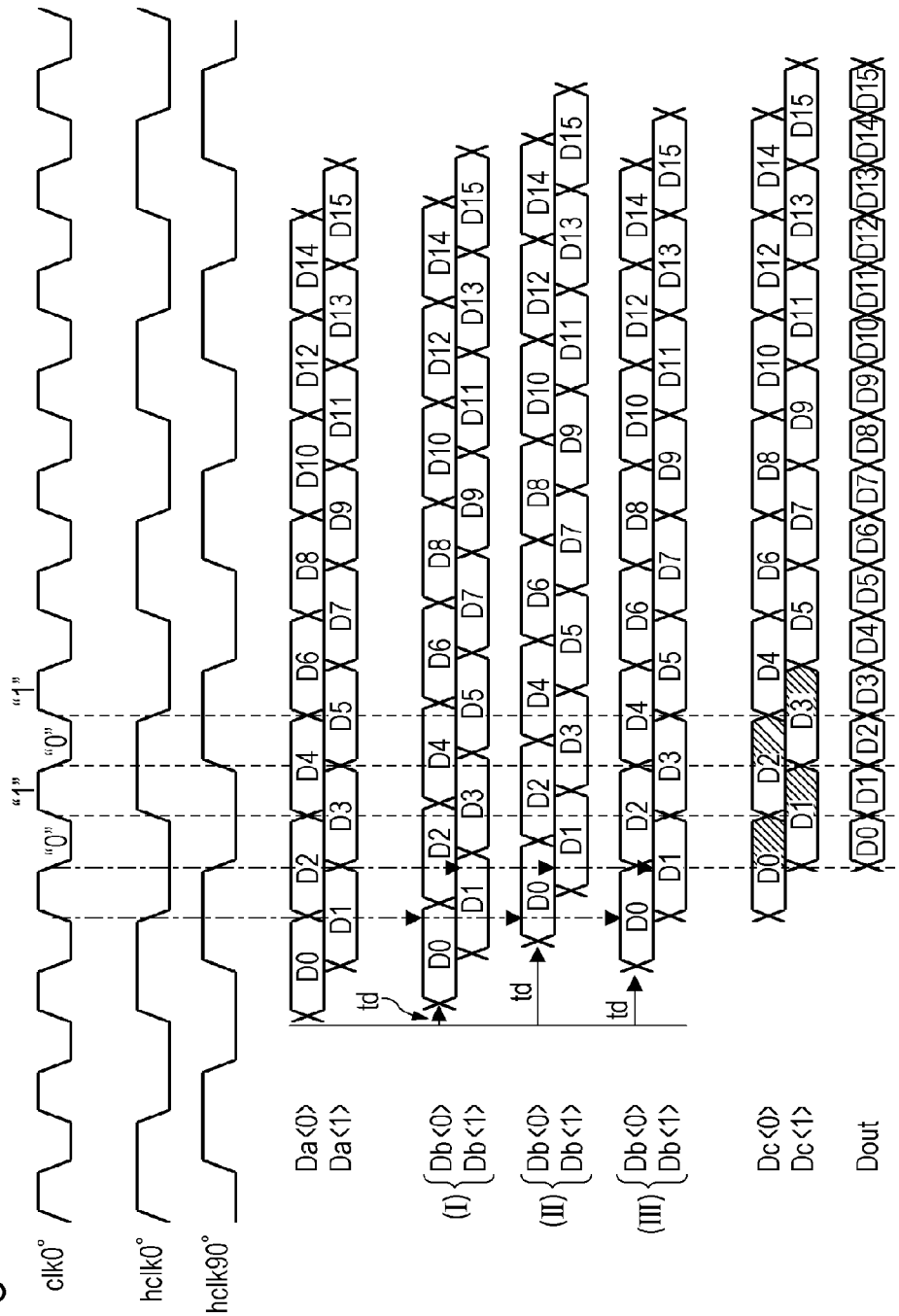
FIG. 6 is a timing chart for explaining operation of the timing control circuit illustrated in FIG. 5.

FIG. 5 is a block diagram illustrating a timing control circuit according to the present embodiment. FIG. 5 illustrates the timing control circuit according to the embodiment, which converts four parallel signals into a serial signal with reference to FIG. 4. FIG. 6 is a timing chart for explaining operation of the timing control circuit illustrated in FIG. 5.

As described in FIG. 5, the 4:2 multiplexer 11 includes two 2:1 multiplexers 111 and 112, and the variable delay circuit 21 includes two variable delay units 211 and 212, which correspond to the two multiplexers, respectively.

Here, the 2:1 multiplexers 111 and 112 and the 2:1 multiplexer 3 have the same circuit configuration, and includes two FFs (1111, 1112, 1121, 1122, 31, and 32), and one selector (1113, 1123, and 33), respectively. In this regard, the multiplexers 3, 111, and 112 illustrated in FIG. 5 are examples, and it is possible to apply various kinds of signal logic and circuit configurations to the multiplexers.

That is to say, the 2:1 multiplexers 3, 111, and 112 may have the same circuit configuration described with reference to FIG. 1, for example, and the clock (control signal) logic for each of the FFs and the selectors may be suitably changed.

In FIG. 6, a clock hclk0° (second control signal) denotes a signal having a frequency (f/2) half a frequency f (for example, 20 GHz) of the clock clk, and a phase of 0°, and a clock hclk90° denotes a frequency half the frequency of the clock clk, and a phase of 90°. Accordingly, the clock hclk0° and the hclk90° have the same frequency (for example, 10 GHz), and different phases by 90° with each other.

As described in FIG. 5 and FIG. 6, the 2:1 multiplexer 111 receives two pieces of the input data DT<0> and DT<2> out of the four pieces of parallel input data DT<0> to DT<3>, and outputs a serially converted output data Da<0> in accordance with the clock hclk0°.

In the same manner, the 2:1 multiplexer 112 receives two pieces of the input data DT<1> and DT<3> out of the four pieces of parallel input data DT<0> to DT<3>, and outputs a serially converted output data Da<1> in accordance with the clock hclk90°.

Accordingly, the data Da<0> changes from D0 to D2, D4, and D6, . . . , and the data Da<1> changes from D1 to D3, D5, and D7, . . . with a delay of a half cycle of the clock clk (¼ cycle of hclk).

The data Da<0> is input into the variable delay unit 211, a suitable delay is given to the data, and is input into the FF 31 of the 2:1 multiplexer 3 as data Db<0>. In the same manner, the data Da<1> is input into the variable delay unit 212, a suitable delay is given to the data, and is input into the FF 32 of the 2:1 multiplexer 3 as data Db<1>.

The variable delay units 211 and 2 have the same circuit configuration, and includes a plurality of (three in FIG. 5) delay elements 2111 to 2113, and 2121 to 2123, which are series-connected, respectively, and selectors 2114 and 2124 that select one from four signals having different delay times (delays). Here, the individual delay elements 2111 to 2113, and 2121 to 2123 form two-stage inverters that are series-connected, for example, and allowed to give delays of a few ps to about ten ps, for example.

In this regard, in FIG. 5, the variable delay units 211 and 212 select one from the four signals having different delays, that is to say, change four-stage delays, but are not limited to this. The variable delay units 211 and 212 may be provided with a further larger number of delay elements to perform delay control more precisely.

In FIG. 6, reference symbols (I) to (III) indicate timings for explaining a relationship between the output Db<0> (Db<1>) of the variable delay unit 211 (212) and a transition timing of the clock clk)(clk0° defining a data fetch timing of the FFs in the 2:1 multiplexer 3.

In this regard, the operation of the variable delay unit 212 is the same as that of the variable delay unit 211, and thus a description will be given of the variable delay unit 211.

Here, (I) in FIG. 6 indicates the timing when the delay (delay time) td of the output Db<0> of the variable delay unit 211 is small, that is to say, when the transition (rising/falling) timing of the clock clk0° is late compared with an ideal state.

Also, (II) in FIG. 6 indicates the timing when the delay td of the output Db<0> of the variable delay unit 211 is large, that is to say, when the transition timing of the clock clk0° is early compared with an ideal state. Further, (III) in FIG. 6 indicates the timing when the delay td of the output Db<0> of the variable delay unit 211 is suitable, that is to say, the transition timing of the clock clk0° is in an ideal state with respect to the output Db<0>.

A timing control circuit according to the present embodiment converges the delay td of the output Db<0> (Db<1>) of the variable delay unit 211 (212) in the ideal state (III) by the pattern generation circuit 12, the variable delay circuit (replica circuit) 22, the decision circuit 4, and the control circuit 5.

The pattern generation circuit 12 includes a selector 121 having input of a low level "0" and a high level "1", and alternately outputs "0" and "1" in accordance with the level of the clock hclk0°.

In FIG. 5, the reason why the pattern generation circuit 12 includes only the selector 121, and does not include the FFs in the 2:1 multiplexer is that the output Da<0> and Da<1> (first data) of the 2:1 multiplexer changes in accordance with the switching operation of the selectors 1113 and 1123.

That is to say, for the data Da' ("010101 . . . ") that is output by the pattern generation circuit 12, it is possible to reproduce Da<0> and Da<1> only by the replica selector 121 corresponding to the selectors 1113 and 1123 in the 2:1 multiplexer.

The variable delay circuit 22 includes, for example, delay elements 221 to 223, and a selector 224, which correspond to the delay elements and the selector in the variable delay unit 211, and gives the same delay as that of the variable delay unit 211 in accordance with a control signal CS' (CS<0>) from the control circuit 5.

Accordingly, the data Db' ("010101 . . . "), which is produced by giving a delay to the data Da' by the variable delay circuit 22, reproduces the data Db<0> that is produced by giving a delay to data Da<0> by the variable delay unit 211.

The output data Db' of the variable delay circuit 22 is input into the decision circuit 4, and is compared with the clock (reception clock CKr) clk0° that defines the data capture timing of the FFs 31 and 32 in the 2:1 multiplexer 3. The decision circuit 4 includes three FFs 41 to 43 and an exclusive-OR (XOR) gate 44.

Figure 7A:
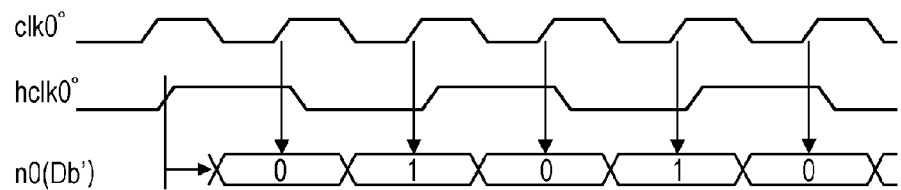
FIGS. 7A, 7B, and 7C are timing charts for explaining operation of a decision circuit in the timing control circuit illustrated in FIG. 5.
Figure 7B:
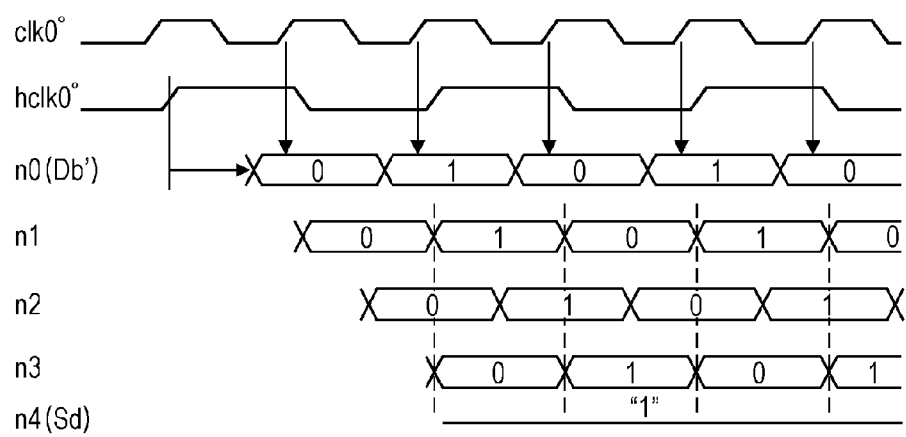
Figure 7C:
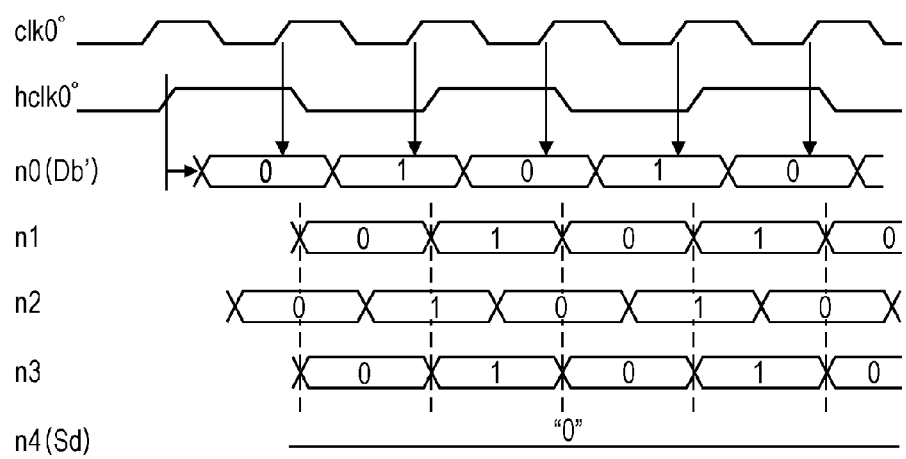

FIGS. 7A, 7B, and 7C are timing charts for explaining operation of a decision circuit in the timing control circuit illustrated in FIG. 5. Here, FIG. 7A illustrates the ideal state (corresponds to (III) in FIG. 6) in which the transition timing (rising timing) of the clock clk0° (clk) falls on the center of the data Db' with respect to the signal (data Db') of the node n0.

Also, FIG. 7B illustrates the state in which the rising timing of the clock clk0° falls on at an early position of the data Db' of the node n0, that is to say, when the delay by the variable delay circuit 22 is long (corresponds to (II) in FIG. 6).

And FIG. 7C illustrates the state in which the rising timing of the clock clk0° falls on at a late position of the data Db' of the node n0, that is to say, when the delay by the variable delay circuit 22 is short (corresponds to (I) in FIG. 6).

As illustrated by the decision circuit 4 in FIG. 5 and FIG. 7B, when the rising timing of the clock clk0° falls on at an early position of the data Db' of the node n0, the data of the node n1 and the data of the node n3 become different levels, and the XOR gate 44 outputs "1".

That is to say, in the case of FIG. 7B, when the data of the node n1 is "1", the data of the node n3 becomes "0". On the contrary, when the data of the node n1 is "0", the data of the node n3 becomes "1". As a result, the output of the XOR gate 44 (signal Sd) becomes "1" all the time.

Also, as illustrated by the decision circuit 4 in FIG. 5 and FIG. 7C, when the rising timing of the clock clk0° falls on at a late position of the data Db' of the node n0, the data of the node n1 and the data of the node n3 become the same level all the time, and the XOR gate 44 outputs "0".

That is to say, in the case of FIG. 7C, when the data of the node n1 is "1", the data of the node n3 becomes "1". On the contrary, when the data of the node n1 is "0", the data of the node n3 becomes "0". As a result, the output of the XOR gate 44 (signal Sd) becomes "0" all the time.

In this regard, in the actual timing control circuit, there is not the ideal state illustrated in FIG. 7A, and the XOR gate 44 outputs "1" as illustrated in FIG. 7B, or the XOR gate 44 outputs "1" as illustrated in FIG. 7C, and then a convergence to the ideal state occurs.

In this manner, the decision circuit 4 (the XOR gate 44) outputs a signal Sd of "0" or "1" to the control circuit 5. As illustrated in FIG. 5, the control circuit 5 includes a filter 51, a logical circuit 52, FFs 53 and 54, and an inverter 55.

Incidentally, there is a time lag from a change of the variable delay circuit 22 to a point in time when the decision circuit 4 determines (re-determines) a timing, and a filter 51 is provided in order to avoid useless changes of the variable delay circuit 22 during that period.

Here, it is possible to apply a counter circuit to the filter 51, for example in order to thin a determination result (Sd) of the decision circuit 4. The output of the filter 51 is input into the logical circuit 52, and the following processing is performed.

Figures 8, 9:
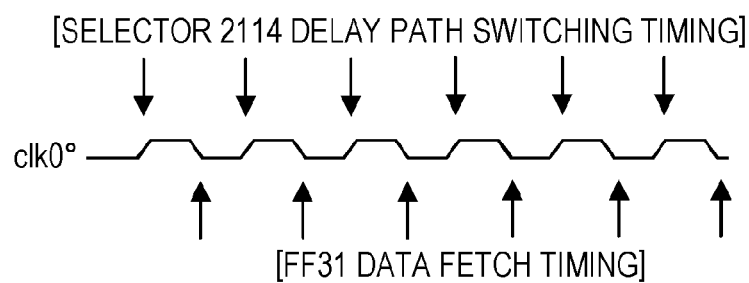
FIG. 8 is a diagram illustrating a truth table of a logical circuit for explaining operation of a control circuit in the timing control circuit illustrated in FIG. 5.
FIG. 9 is a timing chart for explaining operation of a variable delay circuit and a 2:1 multiplexer in a subsequent stage in the timing control circuit illustrated in FIG. 5.

FIG. 8 is a diagram illustrating a truth table of a logical circuit for explaining operation of the control circuit in the timing control circuit illustrated in FIG. 5. FIG. 9 is a timing chart for explaining operation of the variable delay circuit and the 2:1-multiplexer in a subsequent stage in the timing control circuit illustrated in FIG. 5. Here, in the control circuit 5, the logical circuit 52 receives the output of the filter 51, and outputs a 2-bit signal[1:0] to the FF 53, for example.

The truth table of the logical circuit 52 in FIG. 8 represents the output (input to the logical circuit 52) of the filter 51, and the output of the logical circuit 52 (the control signal input to each selector of the variable delay units 211 and 212, and the variable delay circuit (replica) 22).

In this regard, in FIG. 8, decimal notations "0" to "3" of the selector control signal correspond to different selection positions of the delay of each selector. For example, in the variable delay unit 211, the decimal notation "0" means selection of the output of the delay element 2113, which is delayed by all the delay elements 2111 to 2113, and the decimal notation "1" means selection of the output of the delay element 2112, which is delayed by the two delay elements 2111 and 2112.

As illustrated in FIG. 5, the output of the logical circuit 52 is input into the FF 53, which is controlled by the clock CLK0°, and the output of the FF 53 is input into the FF 54, which is controlled by a signal inverted by the inverter 55 of the clock CLK0°.

The control signal CS<0> (CS') fetched from the FF 53 is given to the selector 2114 of the variable delay unit 211, and the selector 224 of the variable delay circuit (replica) to select a signal having a predetermined delay, and is fed back to the logical circuit 52. In this regard, the control signal CS<1> fetched from the FF 54 is given to the selector of the variable delay unit 212 to select a signal having a predetermined delay.

In this regard, the selector 2114 of the variable delay unit 211 is controlled by the control signal CS<0> from the FF 53 operated by rising of the clock clk0°. The selector 2114 performs switching operation in reversed phase on the FF 31 that fetches the data Db<0> by falling of the clock clk0°.

In the same manner, the selector 2124 of the variable delay unit 212 is controlled by the control signal CS<1> from the FF 54 operated by falling of the clock clk0°. The selector 2124 performs switching operation in reversed phase on the FF 32 that fetches the data Db<1> by rising of the clock clk0°.

That is to say, as illustrated in FIG. 9, control is performed such that the switching timing between the variable delay units 211 and 212, and the data fetch timing of the FFs 31 and 32 in the 2:1 multiplexer 3 become the opposite edges of the clock clk0°.

Thereby, the variable delay circuit 21 (the selectors of the variable delay units 211 and 212) fetch data at reversed phase timing of the switching of the delay circuit paths, and thus it is possible for the 2:1 multiplexer 3 (the FFs 31 and 32) to perform stable operation all the time.

In this regard, in the above description, the delay-path switching timing of the selector 2114 controlled by the control signal CS<0> and the data fetch timing of the FF 31 controlled by falling of the clock clk0° are in reversed phases with a difference of 180°. However, it is not typically desired to have reversed phases.

That is to say, if the selector 2114 and the FF 31 operate at the timing with a predetermined margin, it is not typically desired to have reversed phases. This is the same for the operation of the selector 2124 and the FF 32, and both of the operation timings are not typically desired to be in reversed phases.

The output data Dc<0> of the FF 31 and the output data Dc<1> of the FF 32 of the 2:1 multiplexer 3, obtained in this manner, are input into the selector 33. And one of the output data Dc<0> and Dc<1> is selected in accordance with the level of the clock clk0°, and is output as output data Dout.

That is to say, when the level of the inverted clock clk0° is a high level "1", that is to say, when the clock clk0° is "0", the selector 33 selects and outputs Dc<0>. Also, when the clock clk0° is "1", the selector 33 selects and outputs Dc<1>. Thereby, the serially converted output Dout is obtained in synchronism with the clock clk0°.

As described above in detail, by a timing control circuit according to the present embodiment, it is possible to correctly adjust a sampling point of data without using a phase interpolator and without a significant increase in an occupied area and power consumption because of a simple digital circuit configuration.

Figure 10:
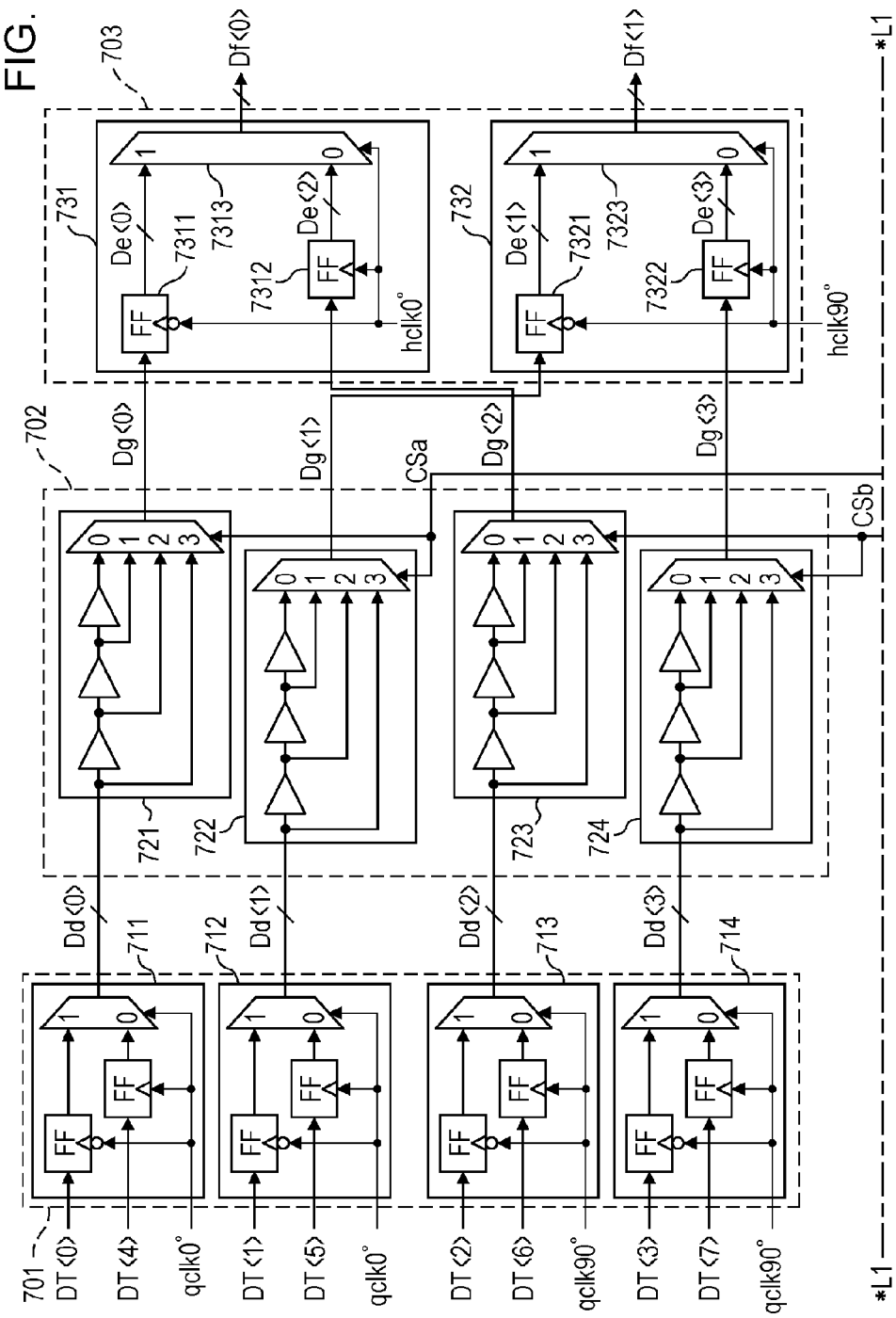
FIG. 10 is a block diagram (1 of 2) illustrating a timing control circuit according to another embodiment.
Figure 11:
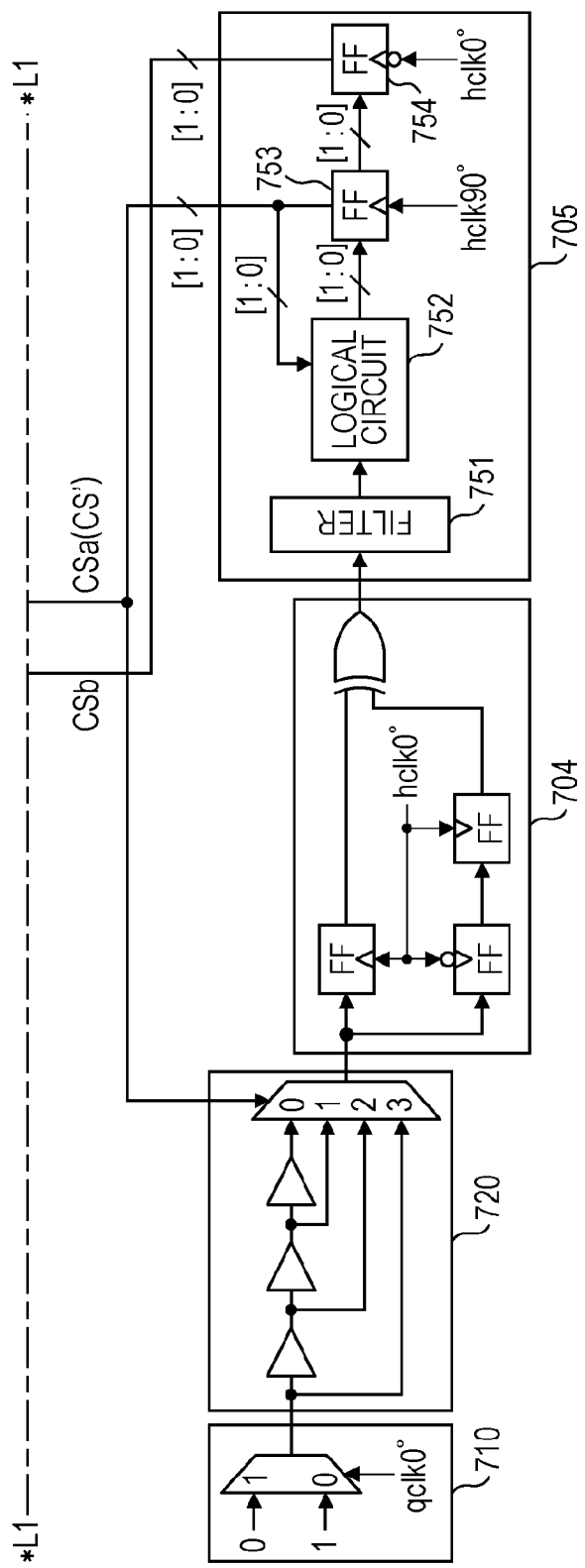
FIG. 11 is a block diagram (2 of 2) illustrating a timing control circuit according to another embodiment.

FIG. 10 and FIG. 11 are block diagrams illustrating a timing control circuit according to another embodiment. FIG. 10 and FIG. 11 illustrate a timing control circuit according to the embodiment, which converts eight parallel signals into two parallel signals.

In FIG. 10 and FIG. 11, reference symbol 701 denotes an 8:4 multiplexer, reference symbol 702 denotes a variable delay circuit, reference symbol 703 denotes a 4:2 multiplexer, reference symbol 704 denotes a decision circuit, and reference symbol 705 denotes a control circuit. Further, reference symbol 710 denotes a pattern generation circuit, and reference symbol 720 denotes a variable delay circuit (replica circuit: second variable delay circuit).

The 8:4 multiplexer 701 includes four 2:1 multiplexers 711 to 714, which operates in accordance with a clock qclk, receives eight pieces of parallel input data DT<0> to DT<7>, and outputs four pieces of parallel data Dd<0> to Dd<3> (first data) in accordance with the clock qclk.

In this regard, a clock qclk0° and a qclk90° (second control signal) have a frequency (f/4: for example, 5 GHz) one-fourth the frequency f (for example, 20 GHz) of the clock clk. The clock qclk0° represents a signal having a phase of 0°, and the clock qclk90° represents a signal having a phase of 90°.

Also, a clock hclk0° and a hclk90° (first control signal) have a frequency (f2: for example, 10 GHz) one half the frequency f (for example, 20 GHz) of the clock clk. The clock hclk0° represents a signal having a phase of 0°, and the clock hclk90° represents a signal having a phase of 90°.

Also, the 2:1 multiplexer 711 receives, for example data DT<0> and DT<4>, which have a largest phase shift among data DT<0> to DT<7>. The 2:1 multiplexer 712 receives the data DT<1> and DT<5>.

In the same manner, the 2:1 multiplexer 713 receives data DT<2> and DT<6>, and the 2:1 multiplexer 714 receives data DT<3> and DT<7>. In this regard, each of the 2:1 multiplexers 711 to 714 operates substantially in the same manner as the 2:1 multiplexer 11 described above, and so on except for a frequency of the clock (qclk0° and qclk90°) at which each FF fetches data, and selection logic of a selector.

The variable delay circuit 702 includes four variable delay units 721 to 724, which give a predetermined delay to the four pieces of input data (four pieces of output data) Dd<0> to Dd<3> from the 8:4 multiplexer 701, respectively.

In this regard, the variable delay units 721 to 724, the variable delay circuit 720, the decision circuit 704, the control circuit 705, and the pattern generation circuit 710 are substantially the same as those described above except for clock phases and frequencies.

That is to say, in the control circuit 705, the data fetch timing of a FF 753 is controlled by the clock hclk90°, and the data fetch timing of a FF 754 is controlled by an inverted logic signal of the clock hclk0°.

Further, in the variable delay circuit 702, the selector of the variable delay unit 721, and the selector of the variable delay unit 722 are controlled by a control signal CSa from the FF 753, which is controlled by the clock hclk90°.

Also, in the variable delay circuit 702, the selector of the variable delay unit 723, and the selector of the variable delay unit 724 are controlled by a control signal CSb from the FF 754, which is controlled by the clock hclk0°.

And in a 2:1 multiplexer 731, data fetch of a FF 7311 is controlled by an inverted logic signal of the clock hclk0°, and data fetch of a FF 7312 is controlled by the clock hclk0°.

Accordingly, for example, the control signal CSa (hclk90°) that controls the selection timing of the selector in the variable delay unit 721, and the clock (the inverted signal of hclk0°) that controls the data fetch timing of the FF 7311 receiving the output of the selector have a phase difference of 90°.

That is to say, in the above-described present embodiment illustrated in FIG. 5, for example, the control signal CS<0> (clk0°) that controls the selector 2114 and the clock (the inverted signal of the clk0°) that controls the FF 31 receiving the output of the selector have a phase difference of 180°. However, in the other embodiment described above, they have a phase difference of 90°.

However, in the 4:2 multiplexer 703 according to the other embodiment, the clocks hclk0° and hclk90° that are used for control have the frequencies one half the frequency of the clock clk0° described with reference to FIG. 5, and thus although there is a phase difference of 90°, the time margin becomes equal, thereby causing no problem. Of course, in the 4:2 multiplexer 703, a phase difference of 180° may be used with the control signal of the selector in the variable delay unit 721 in the preceding stage.

Figure 12:
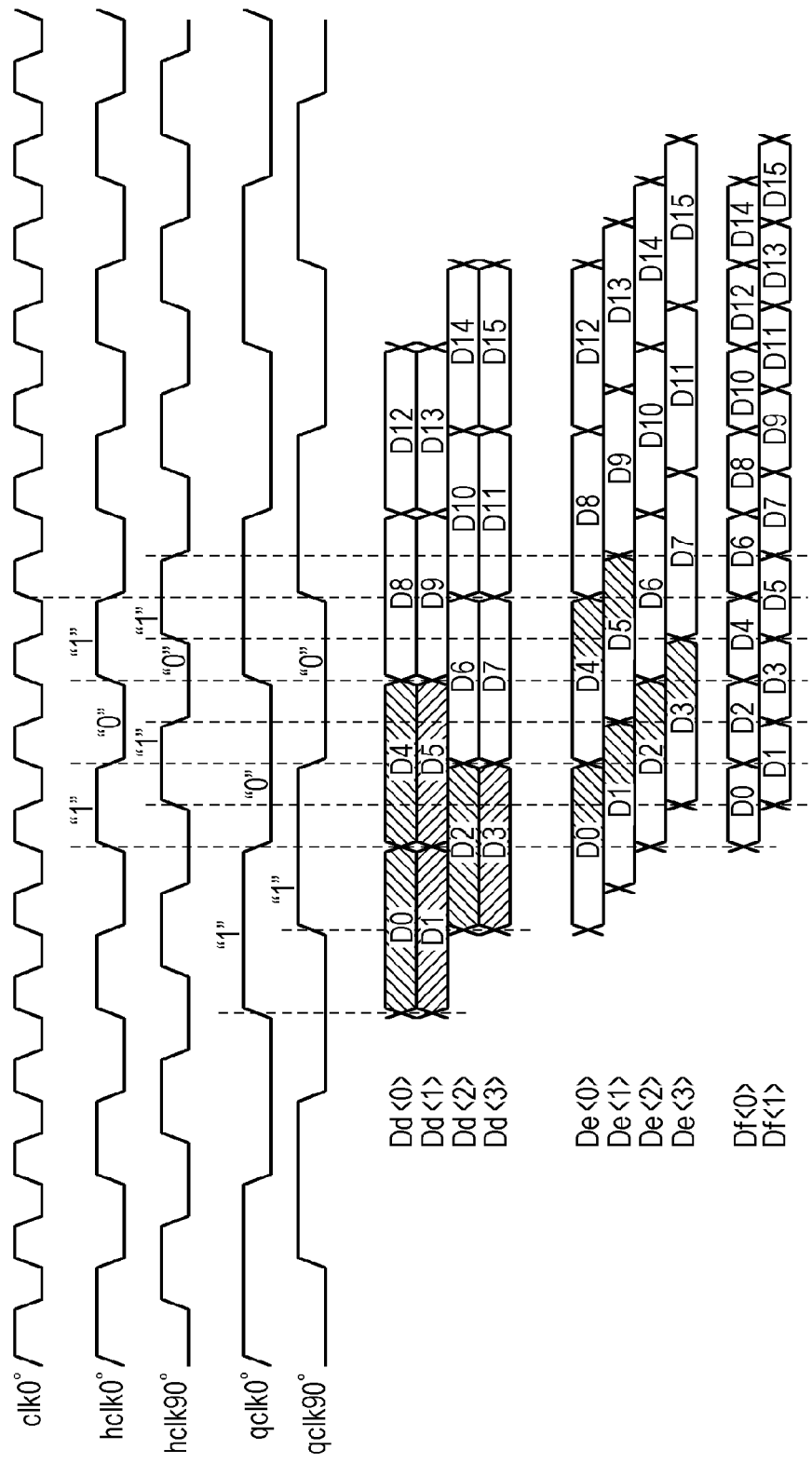
FIG. 12 is a timing chart for explaining operation of the timing control circuit illustrated in FIG. 10 and FIG. 11.

FIG. 12 is a timing chart for explaining operation of the timing control circuit illustrated in FIG. 10 and FIG. 11. In this regard, in FIG. 12, in the same manner as the present embodiment described above, the output data Dd<0> to Dd<3> of the 8:4 multiplexer 701 are converted into data Dg<0> to Dg<3> having phases converged on an ideal state by the variable delay circuit 702 (the variable delay units 721 to 724), and then are input to the 4:2 multiplexer 703.

The 4:2 multiplexer 703 includes the 2:1 multiplexers 731 and 732. The 2:1 multiplexer 731 receives data output Dg<0> and Dg<2> having phases properly controlled by the delay variable units 721 and 723, respectively.

In the same manner, the 2:1 multiplexer 732 receives data output Dg<1> and Dg<3> having phases properly controlled by the delay variable units 722 and 724, respectively.

In the 2:1 multiplexer 731, the selector 7313 selects and outputs output De<0> of the FF 7311 in a period during which the clock hclk0° becomes "1", and selects and outputs output De<2> of the FF 7312 in a period during which the clock hclk0° becomes "0". Accordingly, the output data (second data) Df<0> of the 2:1 multiplexer 731 changes from D0 to D2, D4, D6, . . . in accordance with the clock hclk0°.

In the same manner, in the 2:1 multiplexer 732, the selector 7323 selects and outputs output De<1> of the FF 7321 in a period during which the clock hclk90° becomes "1", and selects and outputs output De<3> of the FF 7322 in a period during which the clock hclk90° becomes "0". Accordingly, the output data Df<1> (second data) of the 2:1 multiplexer 732 changes from D1 to D3, D5, D7, . . . in accordance with the clock hclk90°.

In this manner, it is possible to convert eight pieces of parallel input data DT<0> to DT<7> into two pieces of parallel data Df<0> and Df<1>, and to output the data. In this regard, it is possible to regard the two pieces of the parallel data Df<0> and Df<1> as, for example the output Da<0> and Da<1> of the 4:2 multiplexer 11 in FIG. 5, and to perform processing by the variable delay circuit 21, and so on to obtain the serial data Dout as a matter of course.

In this manner, the variable delay circuit 702 that controls data phase by the pattern generation circuit 710, the variable delay circuit (replica circuit) 720, the decision circuit 704, and the control circuit 705 is not limited to a final stage for converting two pieces of parallel data into serial data.

That is to say, in SerDes that performs parallel-serial conversion, a part that has a smallest timing margin is the final-phase 2:1 multiplexer operating by a highest-speed clock (clk). However, an application of the embodiment is not limited only to a final-phase multiplexer.

However, a multiplexer in the first stage has originally a low communication speed (data transfer rate) of processing data to be processed, and is difficult to be affected by timing variations caused by a change in temperature and power source voltage, and thus advantages of applying the embodiment is not so great as those in the case of a final stage.

In the above, a description has been given of a multiplexer in SerDes performing parallel-serial conversion as an example. However, it is possible to widely apply a timing control circuit according to the embodiment to a circuit that processes a signal having a small timing margin.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A timing control circuit, comprising:
   a first variable delay circuit configured to receive first data having a first communication speed, and to delay the first data by a variable delay;
   a first multiplexer configured to receive an output of the first variable delay circuit, and to convert, based on a reception clock, the first data into second data having a second communication speed different from the first communication speed;
   a second replicating variable delay circuit configured to receive third data having the first communication speed, and to delay the third data by another replicating variable delay which substantially replicates the variable delay of the first variable delay circuit according to a transmission clock for a second multiplexer transmitting the first data having the second communication speed to the first variable delay circuit;
   a decision circuit configured to compare a phase of the delayed third data output of the replicating second variable delay circuit and a phase of the reception clock; and
   a control circuit configured to control the variable delay of the first variable delay circuit and the another replicating variable delay of the second replicating variable delay circuit based on the comparison of the decision circuit.

2. The timing control circuit according to claim 1, wherein the first variable delay circuit includes a number of variable delay units corresponding to the first data, and
   the second replicating variable delay circuit includes a substantially similar circuit configuration as that of the first variable delay circuit.

3. The timing control circuit according to claim 2, wherein the variable delay units include
   a plurality of delay elements configured to give different delays to the first data, respectively, and
   a selector configured to select any one of data provided with the different delays to the first data.

4. The timing control circuit according to claim 3, wherein the selector is configured to select any one of the data provided with the different delays to the first data in accordance with an output of the control circuit.

5. The timing control circuit according to claim 2, wherein switching of delays of the first data by the variable delay units is performed at a different timing from a timing of fetching an output of the variable delay units by the first multiplexer.

6. The timing control circuit according to claim 5, wherein the switching of delays of the first data by the variable delay units is performed at a different timing from timing of taking in the output of the variable delays unit by the first multiplexer by 90° or 180°.

7. The timing control circuit according to claim 1, wherein the second communication speed is two times the first communication speed.

8. The timing control circuit according to claim 7, wherein the third data has a repetition pattern of a high level "1" and a low level "0".

9. The timing control circuit according to claim 8, further comprising a pattern generation circuit configured to generate according to the transmission clock the third data to be transmitted to the second replicating variable delay circuit.

10. The timing control circuit according to claim 9, wherein the pattern generation circuit includes a selector configured to alternately select and output fixed input "0" and "1" in accordance with the first communication speed.

11. The timing control circuit according to claim 7, wherein the second multiplexer converts parallel data which is two times the first data to output the first data in accordance with the transmission clock.

12. The timing control circuit according to claim 11, wherein the transmission clock is a signal having half a frequency of the reception clock.

13. The timing control circuit according to claim 1, wherein the timing control circuit is a parallel-serial conversion circuit configured to convert a plurality of parallel data into serial data, and to output the data.

14. The timing control circuit according to claim 1, wherein the delays of the first variable delay and the second replicating variable delay circuits are continuously-variable delays.

* * * * *